United States Patent [19]

Desai et al.

[11] Patent Number: 5,604,445
[45] Date of Patent: Feb. 18, 1997

[54] APPARATUS, AND CORRESPONDING METHOD, FOR STRESS TESTING SEMICONDUCTOR CHIPS

[75] Inventors: Kishor V. Desai, Vestal; Maganlal S. Patel, Endicott; Sanjeev Sathe, Johnson City, all of N.Y.

[73] Assignee: International Business Machines Corporation, Armonk, N.Y.

[21] Appl. No.: 360,919

[22] Filed: Dec. 21, 1994

[51] Int. Cl.$^6$ .................. H05K 5/00; H01R 9/09
[52] U.S. Cl. .................. 324/755; 439/66; 361/760; 324/765
[58] Field of Search .................. 324/755, 758, 324/757; 439/66; 361/401

[56] References Cited

U.S. PATENT DOCUMENTS

| | | | |
|---|---|---|---|
| 4,150,420 | 4/1979 | Berg | 361/401 |
| 4,597,617 | 7/1986 | Enochs | 339/17 |
| 4,618,739 | 10/1986 | Theobald | 174/52 |
| 4,878,846 | 11/1989 | Schroeder | 439/65 |
| 4,969,828 | 11/1990 | Bright et al. | 439/68 |
| 5,176,524 | 1/1993 | Mizuno et al. | 439/68 |
| 5,276,961 | 1/1994 | Matta et al. | 29/827 |
| 5,297,967 | 3/1994 | Baumberger et al. | 439/66 |

OTHER PUBLICATIONS

IBM TDB, vol. 10, No. 10, Mar. 1968; "Film Supported Probe For the AC Pulse Testing Of Integrated Circuits".
IBM TDB, vol. 36, No. 10, Oct. 1993; "Flip Chip Burn-In Socket".
IBM TDB, vol. 36, No. 12, Dec. 1993; "Socketed Package for Surface Mount Applications".

*Primary Examiner*—Maura K. Regan
*Assistant Examiner*—Barry C. Bowser
*Attorney, Agent, or Firm*—Calfee, Halter & Griswold

[57] ABSTRACT

An apparatus, and a corresponding method, for stress testing both wire bond-type semiconductor chips and C4-type semiconductor chips is disclosed.

30 Claims, 2 Drawing Sheets

APPARATUS, AND CORRESPONDING METHOD, FOR STRESS TESTING SEMICONDUCTOR CHIPS

BACKGROUND OF THE INVENTION

1. Field of the Invention

The invention pertains to an apparatus, and a corresponding method, for stress testing semiconductor chips.

2. Description of the Related Art

There is now a great need to detect faulty semiconductor integrated circuit devices (hereinafter referred to as semiconductor chips) before such semiconductor chips are mounted onto electronic packages, such as multi-chip modules (MCMs). This need arises from the fact that if a faulty chip is detected only after it is mounted onto, for example, an MCM, it may be necessary to scrap the entire MCM, even though the other semiconductor chips on the MCM are not defective.

Stress testing of semiconductor chips, i.e., electrically testing semiconductor chips while subjecting the chips to elevated temperatures, is now recognized as an effective method for detecting faulty chips before such chips are mounted onto, for example, MCMs. As a result, the development of apparati for carrying out such stress testing, particularly apparati which can be used to sequentially test a large number of individual semiconductor chips, has become important. Because semiconductor chips are either wire bond-type semiconductor chips, i.e., semiconductor chips having electrical contact pads to which wire bonds are to be attached, or are C4-type semiconductor chips, i.e., semiconductor chips having contact pads to which C4 (controlled collapse chip connection) solder balls have been attached, the development of apparati capable of carrying out stress testing of both wire bond-type semiconductor chips and C4-type semiconductor chips has become particularly important.

One apparatus which has been developed to achieve stress testing of wire bond-type semiconductor chips includes a clamp housing containing a spring at its upper end. A substantially rigid and inflexible base is positioned at the lower end of the clamp housing. This base includes a depression in its upper surface, which contains an elastomeric insert. A flexible, polyimide layer overlies the base and insert. The upper surface of the flexible, polyimide layer includes a plurality of gold bumps.

In the operation of the above-described apparatus, a wire bond-type semiconductor chip is placed on the upper surface of the flexible, polyimide layer, directly over the elastomeric insert and directly beneath the spring. By pressing the clamp housing toward the base, a force is applied to the back of the semiconductor chip through the spring. As a result of this force, the contact pads on the semiconductor chip are brought into electrical contact with the gold bumps on the flexible, polyimide layer. While in this configuration, test voltages and/or test currents are applied to the gold bumps, and thereby applied to the contact pads, and the apparatus and semiconductor chip are heated to an elevated temperature.

Significantly, the total force which must be applied to the back of the semiconductor chip to achieve good electrical contact between the chip contact pads and the gold bumps corresponds to a force of 0.5 newtons or more being applied to each contact pad. This constitutes a relatively large force per chip contact pad and is thought to be due, in part, to the fact that each gold bump electrically contacts a corresponding chip contact pad at only a single point. Unfortunately, so large a force per chip contact pad often results in unacceptable, physical damage to the semiconductor chip.

Thus, those engaged in the development of apparati, and corresponding methods, for stress testing semiconductor chips have sought, thus far without success, apparati and methods which do not damage chips, which can be used to sequentially test a large number of chips and which can be used to test both wire bond-type chips and C4-type chips.

SUMMARY OF THE INVENTION

The invention involves an apparatus, and a corresponding method, for stress testing both wire bond-type semiconductor chips and C4-type semiconductor chips, which apparatus and method avoid physical damage to the chips. Moreover, the inventive apparatus can readily be used to sequentially stress test at least one hundred semiconductor chips and, it is believed, can be used to stress test as many as one thousand, and perhaps even as many as ten thousand, semiconductor chips.

The inventive apparatus includes an electrically insulating, substantially rigid base made of, for example, a ceramic, such as alumina, or a glass/epoxy resin, such as FR 4. This base includes an upper surface and a lower surface, with the upper surface containing a depression sized to receive a semiconductor chip. It is intended that the chip be placed within the depression, with the chip circuitry, including the chip contact pads, facing upwardly. The upper surface of the base also includes base contact pads positioned outside the depression. The base further includes electrically conductive pins which extend through the thickness of the base into electrical contact with the base contact pads. These pins also extend from the lower surface of the base.

Significantly, the inventive apparatus also includes a flexible, electrically insulating layer, e.g., a polyimide layer, which is placed over the upper surface of the base and over the circuitry-bearing surface of the chip. This flexible layer includes a lower surface having a first plurality of dendritic contacts which are substantially aligned with the chip contact pads, as well as a second plurality of dendritic contacts which are substantially aligned with the base contact pads. In addition, the lower surface of the flexible layer includes fan-out electrical circuitry which electrically connects the second plurality of dendritic contacts to the first plurality of dendritic contacts.

The inventive apparatus further includes a snap-on lid, which is to be placed over the flexible layer and mated to, i.e., snapped onto, the base. This lid includes a lower surface from which first and second pluralities of elastomeric cylinders project downwardly. The first plurality of elastomeric cylinders are substantially aligned with the first plurality of dendritic contacts, while the second plurality of elastomeric cylinders are substantially aligned with the second plurality of dendritic contacts. When the lid is placed over the flexible layer and mated to the base, the first plurality of elastomeric cylinders serves to apply a force to each of the first plurality of dendritic contacts, and the second plurality of elastomeric cylinders serves to apply a force to each of the second plurality of dendritic contacts. As a result, good electrical contact is achieved between the first plurality of dendritic contacts and the chip contact pads, and between the second plurality of dendritic contacts and the base contact pads. Importantly, the force applied to each of the dendritic contacts and communicated to each of the chip contact pads (and each of the base contact pads) is less than, and usually substantially less than, 0.5 newtons. In fact, this force can be as small as about 0.2 newtons. Consequently, physical damage to the semiconductor chip is avoided.

BRIEF DESCRIPTION OF THE DRAWINGS

The invention is described with reference to the accompanying drawings, wherein.

DETAILED DESCRIPTION OF THE PREFERRED EMBODIMENT(S)

The invention involves an apparatus, and a corresponding method, for stress testing both wire bond-type semiconductor chips and C4-type semiconductor chips. Significantly, this apparatus and method involve the application of less than, and usually substantially less than, 0.5 newtons of force per chip contact pad, which serves to avoid physical damage to the chip. In fact, the applied force per chip contact pad can be as little as 0.2 newtons. Moreover, the inventive apparatus can readily be used to sequentially stress test at least one hundred, and perhaps as many as one thousand, and perhaps even as many as ten thousand, semiconductor chips.

Figure 1:
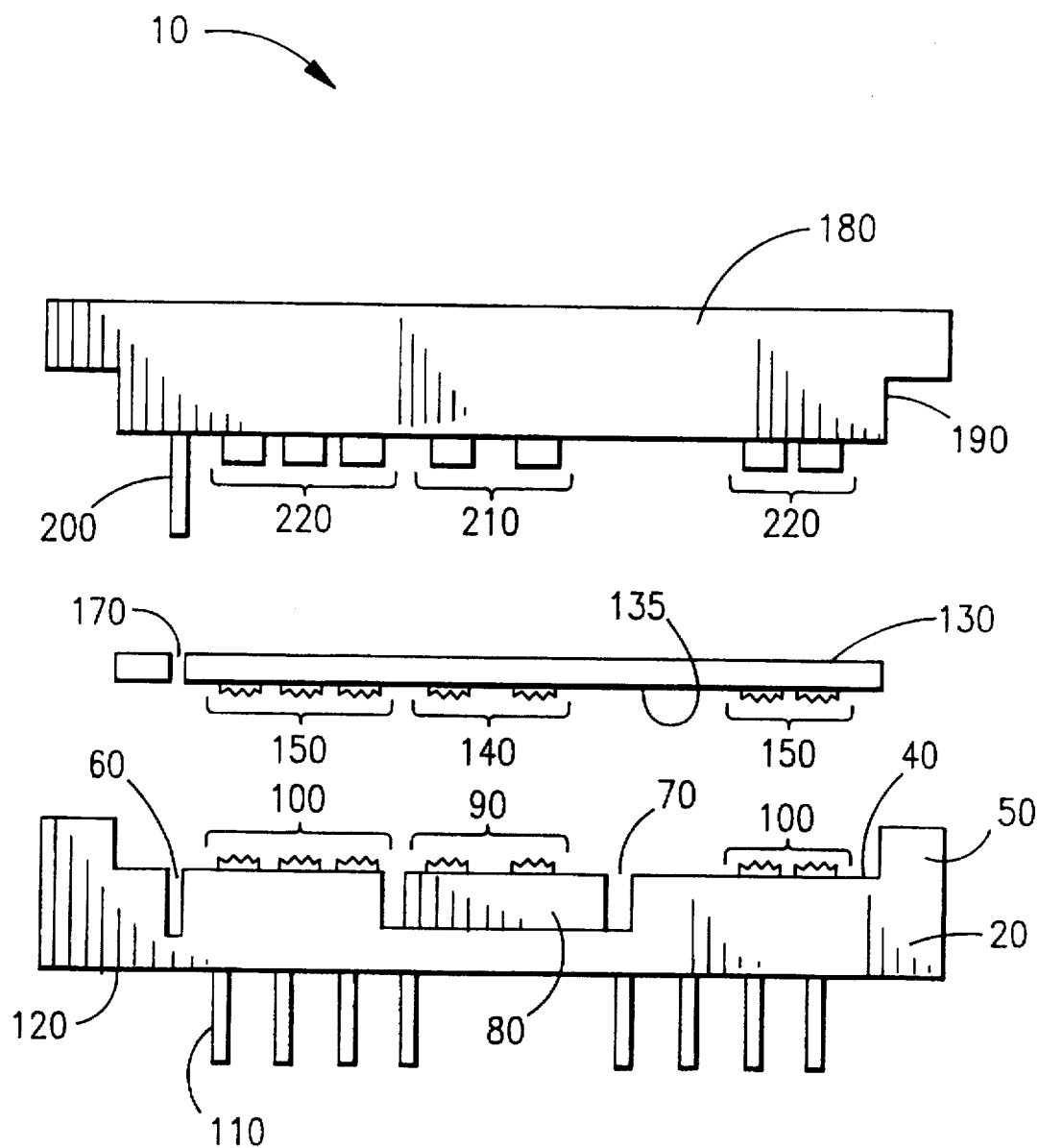
FIG. 1 is an exploded, cross-sectional view of a preferred embodiment of the inventive apparatus.
Figure 2:
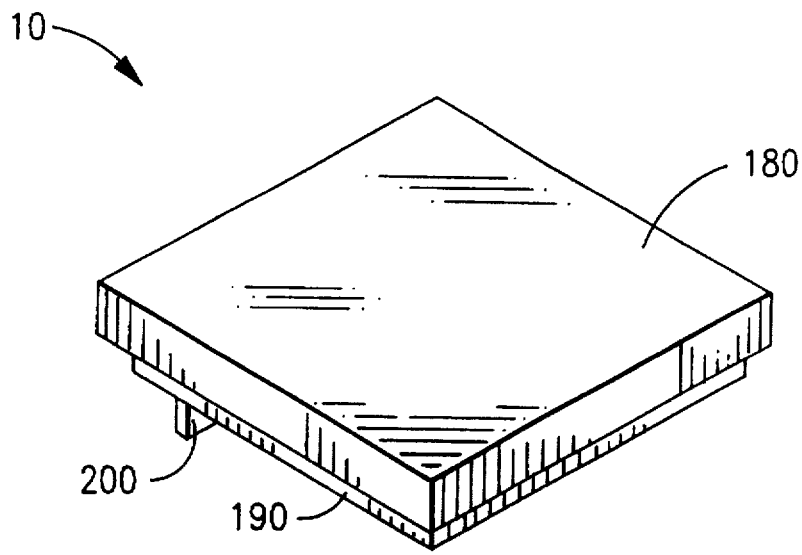
FIG. 2 is an exploded, perspective view of the preferred embodiment of the inventive apparatus.
Figure 2:
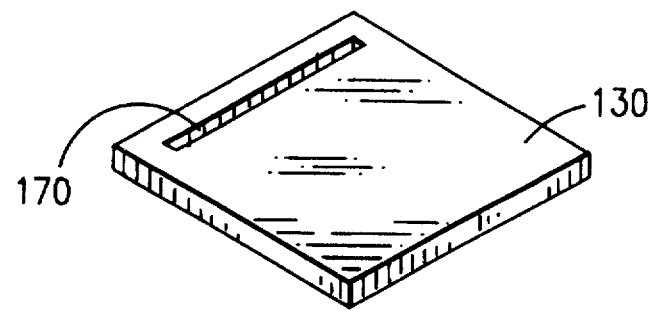
Figure 2:
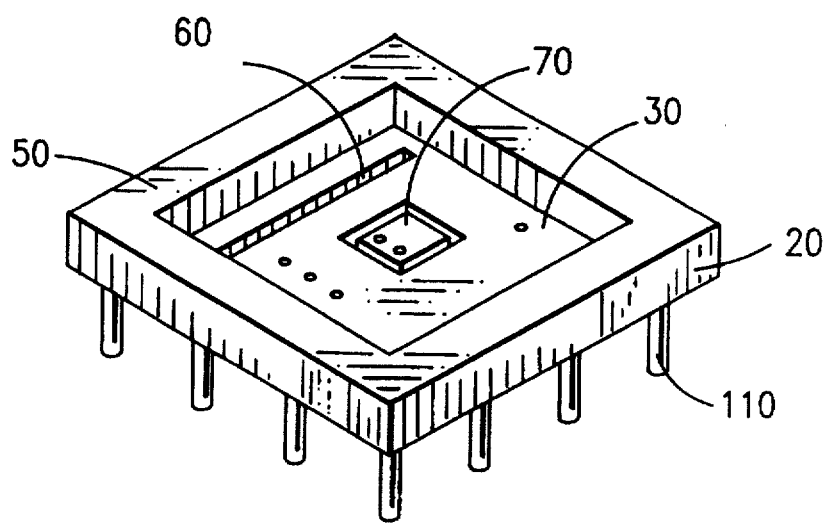

With reference to FIGS. 1 and 2, a preferred embodiment of the inventive apparatus 10 includes an electrically insulating, substantially rigid base 20. (For purposes of the invention, the base 20 is substantially rigid provided it exhibits a Young's modulus of elasticity equal to or greater than about 5,000,000 psi.) The base 20 is made of, for example, a ceramic, such as alumina, or a glass/epoxy resin, such as that commonly referred to in the printed circuit board industry as FR 4. The function of the base 20 is to provide an opposing force to the force applied to a semiconductor chip placed on the base 20, as more fully discussed below.

As depicted in FIGS. 1 and 2, the base 20 includes a relatively large, rectangular depression 30, having lateral dimensions which extend most of the length and width of the base 20. The surface at the bottom of this rectangular depression 30 is denoted by the number 40, and is hereinafter referred to as the upper surface of the base 20. As more fully discussed below, the depression 30 is is sized to receive a central portion 190 of a lid 180, which central portion is press fitted into the depression 30. A ridge 50 encircles the depression 30 and serves to grip the central portion 190 of the lid 180 inserted into the depression 30.

The upper surface 40 (the bottom of the rectangular depression 30) of the base 20 includes a linear depression 60, at one end of the upper surface 40, which serves to receive a flange-like member 200 projecting from the central portion 190 of the lid 180. The combination of the linear depression 60 and flange-like member 200 serve to achieve proper alignment of the lid 180 relative to the base 20.

As shown in FIGS. 1 and 2, the upper surface 40 of the base 20 also includes a relatively small, rectangular, centrally located depression 70. This depression is sized to receive either a wire bond-type or a C4-type semiconductor chip 80 to be stress tested. It is intended that the chip 80 be placed within the depression 70 so that the chip circuitry, including the chip contact pads 90, face upwardly. It should be noted that the depth of the relatively small depression 70 is chosen so that when the chip 80 is placed within the depression 70 the circuitry-bearing surface of the chip 80 is substantially co-planar with the upper surface 40.

As more clearly shown in FIG. 1, the upper surface 40 of the base 20 bears a plurality of electrically conductive contact pads, e.g., copper contact pads, 100, which are positioned outside the depression 70, and thus serve to encircle the depression 70, as well as a chip 80 placed within the depression 70. These contact pads 100, which are hereinafter referred to as the base contact pads 100, are in electrical contact with electrically conductive pins 110, which extend through the thickness of the base 20 from the upper surface 40 to the lower surface 120 of the base 20, and even extend beyond the lower surface 120.

It should be noted that the thickness of the portion of the base 20 which bears a chip 80 to be tested (i.e., the thickness of the base 20 as measured from the bottom of the depression 70 to the bottom surface 120 of the base 20) ranges from about 0.1 inch to about 0.2 inches. Thicknesses less than about 0.1 inch are undesirable because the chip-bearing portion of the base 20 lacks the rigidity needed to provide the opposing force, mentioned above. Thicknesses greater than about 0.2 inches are unnecessary because they offer no additional advantage.

The thickness of the base 20 outside the depression 70 (i.e., the thickness of the base 20 as measured from the upper surface 40 to the bottom surface 120) need only exceed the thickness of the chip-bearing portion of the base 20 by the thickness of the chip 80 to be tested. Preferably, this excess thickness is substantially equal to the thickness of the chip 80 to be tested so that the upper surface of the chip 80 is substantially co-planar with the upper surface 40.

Significantly, the apparatus 10 also includes a flexible, electrically insulating layer 130, which overlies the upper surface 40 of the base 20 and the circuitry-bearing surface of a chip 80 to be tested. (For purposes of the present invention, flexible means that the layer 130 has a Young's modulus of elasticity which is equal to or less than about 2,000,000 psi.) The layer 130 must be capable of withstanding the elevated temperatures employed in stress testing, e.g., a temperature of 180 degrees C. Consequently, the layer 130 is preferably of polyimide, such as the polyimide sold under the trade name Upilex by UBE Industries, Inc., of Yamaguchi Prefecture, Japan, which readily withstands such elevated temperatures.

If the flexible, electrically insulating layer 130 is of polyimide, then the thickness of the layer 130 preferably ranges from about 0.001 inches to about 0.003 inches. Thicknesses less than about 0.001 inches are undesirable because the corresponding layers are undesirably fragile. Thicknesses greater than about 0.003 inches are undesirable because the corresponding layers are rigid and lack the needed compliance, discussed below.

As more clearly shown in FIG. 1, the flexible, electrically insulating layer 130 includes a first plurality of dendritic contacts 140 and a second plurality of dendritic contacts 150 extending from the lower surface 135 of the layer 130. The first plurality of dendritic contacts 140 are positioned so as to be substantially aligned with the chip contact pads 90, while the second plurality of dendritic contacts 150 are positioned so as to be substantially aligned with the base contact pads 100.

The first and second pluralities of dendritic contacts 140 and 150 are, for example, of palladium, and are fabricated by initially forming corresponding contact pads of, for example, copper, on the lower surface 135 of the layer 130. Then, the dendritic contacts themselves are formed on these contact pads using the now conventional electroplating techniques described in, for example, U.S. Pat. No. 5,137,461, which is hereby incorporated by reference. It is these dendritic contacts which make direct electrical contact with the chip contact pads 90 and the base contact pads 100.

The contact pads on which the dendritic contacts are formed have a thickness of, for example, 0.0014 inches. When formed on such contact pads, the dendritic contacts extend from these contact pads by a distance ranging from about 0.001 inches to about 0.003 inches. Distances less than about 0.001 inches are undesirable because the corresponding dendritic contacts are so short that there is a significantly increased likelihood that they will fail to make good electrical contact to the chip and/or base contact pads. Distances greater than about 0.003 inches are undesirable because the corresponding dendritic structures exhibit undesirably low rigidity.

The width of each dendritic contact preferably ranges from about 0.002 inches to about 0.004 inches. Widths less than about 0.002 inches are undesirable because the corresponding dendritic contacts contain undesirably few dendrites per contact pad and therefore achieve either poor electrical contact with the pad or require the application of an undesirably large contact force to achieve good electrical contact. Widths greater than about 0.004 inches are undesirable because such a dendritic contact may electrically contact two or more adjacent contact pads and cause an unacceptable electrical short circuit.

Attached to the bottom of the flexible, electrically insulating layer 130 is a patterned layer 160 (not shown) of electrically conductive material, such as copper. This patterned, electrically conductive layer 160 constitutes fan-out circuitry which electrically connects the second plurality of dendritic contacts 150 to the first plurality of dendritic contacts 140. If the thickness of the flexible, electrically insulating layer 130 ranges from about 0.001 inches to about 0.003 inches, then the corresponding thickness of the patterned layer 160 ranges from about 0.0003 inches to about 0.001 inches. Thicknesses less than about 0.0003 inches are undesirable because the patterned layer becomes susceptible to physical damage. Thicknesses greater than about 0.001 inches are undesirable because the combination of the flexible layer 130 and patterned layer 160 exhibits undesirably increased rigidity.

It should be noted that the layers 130 and 160 include an aperture 170 through which the flange-like member 200 projecting from the central portion 190 of the lid 180 is intended to be inserted into the linear depression 60 in the base 20.

As shown in FIGS. 1 and 2, the apparatus 10 includes a lid 180 of, for example, aluminum or stainless steel. This lid includes a central, downwardly projecting portion 190 which is sized for frictional insertion into the depression 30 in the substrate 20. Projecting from the central portion 190 is the flange-like member 200 intended for insertion through the aperture 170 in the layers 130 and 160 and into the linear depression 60 in the upper surface 40 of the base 20.

Significantly, as more clearly shown in FIG. 1, the central portion 190 of the lid 180 includes a first plurality 210 and second plurality 220 of elastomeric cylinders projecting from the bottom of the central portion 190. These cylinders are fabricated from, for example, the elastomeric material sold under the trade name Viton by DuPont of Wilmington, Del., U.S.A. and are molded to the bottom of the central portion 190. The first plurality 210 of elastomeric cylinders are substantially aligned with the first plurality of dendritic contacts 140, while the second plurality 220 of elastomeric cylinders is substantially aligned with the second plurality of dendritic contacts 150. When the lid 180 is mated with the base 20, the first plurality 210 of elastomeric cylinders serves to exert a downward force against each of the first plurality 140 of dendritic contacts, resulting in good electrical contacts between these dendritic contacts and the chip contact pads 90. Similarly, the second plurality 220 of elastomeric cylinders serves to exert a downward force against each of the second plurality 150 of dendritic contacts, resulting in good electrical contacts between these dendritic contacts and the base contact pads 100. As noted above, the resulting force communicated to each chip contact pad, as well as to each base contact pad, is substantially less than about 0.5 newtons, and can be as small as about 0.2 newtons.

Preferably, each elastomeric cylinder has a diameter which ranges from about 1.0 times, to about 2.0 times, the width of the corresponding dendritic contact. Diameters smaller than about 1.0 times the width of the dendritic contact are undesirable because the resulting contact force between the dendritic contact and the corresponding contact pad may be undesirably small. Diameters larger than about 2.0 times the width of the dendritic contact are undesirable because the resulting contact force between the dendritic contact and the corresponding contact pad may be undesirably large, possibly crushing the dendritic contact.

The height of each elastomeric cylinder ranges from about 0.002 inches to about 0.004 inches. Heights less than about 0.002 inches are undesirable because the corresponding elastomeric cylinders exhibit undesirably little compliancy and produce undesirably large forces, possibly crushing dendritic contacts. Heights greater than about 0.004 inches are undesirable because the corresponding elastomeric cylinders often produce undesirably small contact forces, which may result in poor electrical contacts between dendritic contacts and contact pads.

In the operation of the apparatus 10, a wire bond-type or C4-type semiconductor chip 80 to be stress tested is placed face-up in the depression 70 in the base 20. The flexible layer 130 is placed over the upper surface 40 of the base 20, as well as over the circuitry-bearing surface of the chip 80. The lid 180 is then mated to the base 20, with the flange-like member 200 being inserted through the aperture 170 in the layers 130 and 160 into the linear depression 60 in the base 20, and the central portion 190 of the lid 180 being press fitted into the depression 30 in the base 20. An electrical socket is then applied to the pins 110, and test voltages and/or test currents are then communicated to the chip contact pads 90 via the pins 110, base contact pads 100, the second plurality of dendritic contacts 150, fan-out circuitry 160 and the first plurality of dendritic contacts 140. The apparatus 10, containing the chip 80, is also heated to an elevated temperature, e.g., 180 degrees C., via, for example, an oven.

In connection with the operation of the apparatus 10, it must be noted that the compliance associated with the flexible layer 130 permits any small mismatches in height between the upper surface 40 of the base 20 and the circuitry-bearing surface of the semiconductor chip 80 being tested to be overcome. That is, if there were such a small mismatch in height, and if the layer 130 were rigid instead of flexible, it is unlikely that uniformly good electrical contact could be achieved between the first plurality of dendritic contacts 140 and the chip contact pads 90. By contrast, in the present invention, the compliance exhibited by the flexible layer 130 permits small mismatches in height to be overcome and uniformly good electrical contact to be achieved.

While the invention has been particularly shown and described with reference to preferred embodiments thereof, it will be understood by those skilled in the art that various changes in form and details may be made therein without departing from the spirit and scope of the invention.

We claim:

1. An electronic package, comprising:
   an electrically insulating base including first and second surfaces, said first surface bearing at least one semiconductor chip having a first plurality of contact pads, said first surface also bearing a second plurality of contact pads;
   means, extending from said second surface, for communicating voltages and/or currents to said second plurality of contact pads on said first surface;
   a flexible, electrically insulating layer overlying said first surface of said base and said semiconductor chip, said layer bearing a first plurality of dendritic contacts substantially aligned with said first plurality of contact pads and a second plurality of dendritic contacts substantially aligned with said second plurality of contact pads, said layer also bearing fan-out circuitry electrically connecting said second plurality of dendritic contacts to said first plurality of dendritic contacts; and
   a lid, overlying said flexible, electrically insulating layer, which mates with said base, said lid including means for applying a force to each of said dendritic contacts when said lid is mated with said base so as to achieve electrical contact between said first and second plurality of dendritic contacts and, respectively, said first and second plurality of contact pads.

2. The electronic package of claim 1, wherein said means for communicating voltages and/or currents to said second plurality of contact pads includes a plurality of electrically conductive pins extending from said second surface and extending through a thickness of said base to said first surface into electrical contact with said second plurality of contact pads.

3. The electronic package of claim 1, wherein said means for applying a force to each of said dendritic contacts includes a plurality of elastomeric cylinders projecting from said lid and substantially aligned with said dendritic contacts and said contact pads.

4. The electronic package of claim 1, wherein said first surface includes a depression, said semiconductor chip being positioned within said depression.

5. A method for electrically testing a semiconductor chip bearing a first plurality of contact pads, comprising the steps of:
   placing said semiconductor chip bearing said first plurality of contact pads onto a first surface of an electrically insulating base bearing a second plurality of contact pads, said base including means, extending from a second surface of said base, for communicating voltages and/or currents to said second plurality of contact pads on said first surface;
   placing a flexible, electrically insulating layer over said first surface of said base and over said semiconductor chip, said layer bearing a first plurality of dendritic contacts substantially aligned with said first plurality of contact pads and a second plurality of dendritic contacts substantially aligned with said second plurality of contact pads, said layer also bearing fan-out circuitry electrically connecting said second plurality of dendritic contacts to said first plurality of dendritic contacts; and
   placing a lid over said flexible, electrically insulating layer and mating said lid with said base, said lid, when mated, including means for applying a force to each of said dendritic contacts so as to achieve electrical contact between said first and second plurality of dendritic contacts and, respectively, said first and second plurality of contact pads.

6. The method of claim 5, further comprising the step of applying voltages and/or currents to said means for communicating voltages and/or currents to said second plurality of contact pads on said first surface.

7. The method of claim 6, further comprising the step of heating said semiconductor chip to a temperature of about 180 degrees C.

8. A method for electrically testing a semiconductor chip bearing a first plurality of contact pads, comprising the steps of:
   placing said semiconductor chip bearing said first plurality of contact pads onto a first surface of an electrically insulating base bearing a second plurality of contact pads;
   placing a flexible, electrically insulating layer over said surface of said base and over said semiconductor chip, said 8 layer including first and second surfaces, said first surface being closer to said substrate than said second surface and bearing a first plurality of dendritic contacts substantially aligned with said first plurality of contact pads and a second plurality of dendritic contacts substantially aligned with said second plurality of contact pads, said first surface also bearing fan-out circuitry electrically connecting said second plurality of dendritic contacts to said first plurality of dendritic contacts; and
   applying a plurality of forces to a plurality of separate regions of said second surface having positions which correspond to the positions of said dendritic contacts on said first surface so as to achieve electrical contact between said first and second plurality of dendritic contacts and, respectively, said first and second plurality of contact pads.

9. The method of claim 8, further comprising the step of communicating voltages and/or currents to said second plurality of contact pads.

10. The method of claim 9, further comprising the step of heating said semiconductor chip to a temperature of about 180 degrees C.

11. A device for sequentially testing a plurality of semiconductor chips, each chip defining a plurality of chip electrical contacts on a common chip surface, said device comprising
   an electrically insulated base having a chip-receiving surface defining a recess therein for receiving said chip such that said chip electrical contacts face away from said base when said chip is in said recess,
   a flexible insulating layer facing said chip-receiving surface, said flexible insulating layer defining a first plurality of dendritic contacts substantially aligned with said chip electrical contacts, said flexible insulating layer further defining electrical circuitry electrically connected to said first plurality of dendritic contacts for communicating voltages and/or currents to said first plurality of dendritic contacts, and
   a lid overlying said flexible insulating layer, said lid being adapted to mate with said base while said flexible insulating layer is maintained between said base and said lid, said lid including means for applying a force to each of said dendritic contacts when said lid is mated with said base so as to achieve electrical contact between said dendritic contacts and said chip electrical contacts.

12. The device of claim 11, wherein said chip-receiving surface defines base contact pads, wherein said base defines base electrical connection means electrically connected to said base contact pads for communicating voltages and/or currents to said base contact pads, wherein said flexible insulating layer defines a second plurality of dendritic contacts substantially aligned with said base contact pads, and wherein said electrical circuitry electrically connects said first plurality of dendritic contacts with said second plurality of dendritic contacts so that test voltage and/or current can be applied to said chip contact pads by means of said base electrical connection means.

13. The device of claim 12, wherein said base defines a second surface opposite said chip-receiving surface, said base electrical connection means including electrical contacts in said second surface.

14. The device of claim 13, further comprising compression means for forcing said base and said lid together to thereby cause a force to be applied to each of said dendritic contacts for secure electrical connection to a respective chip electrical contact, said compression means allowing said lid and said base to be drawn apart after testing of a chip is complete so that another chip and be inserted into, and tested by, said device.

15. The device of claim 11, further comprising compression means for forcing said base and said lid together to thereby cause a force to be applied to each of said dendritic contacts for secure electrical connection to a respective chip electrical contact, said compression means allowing said lid and said base to be drawn apart after testing of a chip is complete so that another chip and be inserted into, and tested by, said device.

16. The device of claim 11, wherein said means for applying a force comprises elastomeric cylinders.

17. The device of claim 11, wherein said electrically insulating layer is about 0.001 to 0.003 inch thick and further wherein said dendritic contacts are about 0.001 to 0.003 inch thick.

18. The method of claim 5, further comprising separating said lid and said base so that said chip can be withdrawn therefrom and another chip inserted therein for testing.

19. The method of claim 8, further comprising withdrawing said chip from said base so that another chip can be placed thereon for testing.

20. The device of claim 11, wherein said recess is deep enough so that the common chip surface of said chip and the chip-receiving surface of said base are essentially coplanar when said chip is received in said base.

21. The device of claim 20, wherein said flexible insulating layer is essentially planar.

22. The device of claim 21, wherein said flexible insulating layer has a Young's modulus of 2,000,000 or less, is stable against degradation at 180° C., and is about 0.001 to 0.003 inch thick.

23. The device of claim 14, wherein said means for applying a force comprises elastomeric cylinders.

24. The device of claim 23, wherein said recess is deep enough so that the common chip surface of said chip and the chip-receiving surface of said base are essentially coplanar when said chip is received in said base.

25. The device of claim 24, wherein said flexible insulating layer is essentially planar.

26. The device of claim 25, wherein said flexible insulating layer has a Young's modulus of 2,000,000 or less, is stable against degradation at 180° C., and is about 0.001 to 0.003 inch thick.

27. The device of claim 1, wherein said lid is removably mounted on said base.

28. The device of claim 11, wherein said lid is removably mounted on said base.

29. The method of claim 5, wherein a plurality of said semiconductor chips are tested in sequence.

30. The method of claim 8, wherein a plurality of said semiconductor chips are tested in sequence.

* * * * *